United States Patent [19]

Dion

[11] Patent Number: 5,277,756
[45] Date of Patent: Jan. 11, 1994

[54] POST FABRICATION PROCESSING OF SEMICONDUCTOR CHIPS

[75] Inventor: John B. Dion, Bradford, Mass.

[73] Assignee: Digital Equipment Corporation, Maynard, Mass.

[21] Appl. No.: 899,084

[22] Filed: Jun. 15, 1992

Related U.S. Application Data

[62] Division of Ser. No. 547,652, Jul. 2, 1990, Pat. No. 5,130,275.

[51] Int. Cl.[5] .................. B44C 1/22; C23F 1/00
[52] U.S. Cl. ..................... 156/664; 156/634; 437/183; 437/190; 437/192; 437/246
[58] Field of Search ............... 437/183, 190, 192, 246, 437/944; 156/664, 634

[56] References Cited

U.S. PATENT DOCUMENTS

| | | | |
|---|---|---|---|
| 3,625,837 | 12/1971 | Nelson et al. | 204/15 |
| 4,000,842 | 1/1977 | Burns | 228/180 A |
| 4,087,314 | 5/1978 | George et al. | 156/643 |
| 4,188,438 | 2/1980 | Burns | 428/209 |
| 4,505,029 | 3/1985 | Owyang et al. | 29/589 |
| 4,510,017 | 4/1985 | Barber | 156/651 |
| 4,519,872 | 5/1985 | Anderson, Jr. et al. | 156/643 |
| 4,671,852 | 6/1987 | Pyke | 156/644 |
| 4,701,363 | 10/1987 | Barber | 428/137 |
| 4,787,958 | 11/1988 | Lytle | 156/664 |
| 4,792,532 | 12/1988 | Ohtani et al. | 437/206 |
| 4,810,620 | 3/1989 | Takiar et al. | 430/314 |
| 4,812,421 | 3/1989 | Jung et al. | 437/211 |
| 4,922,322 | 5/1990 | Mathew | 357/69 |
| 4,927,505 | 5/1990 | Sharma et al. | 204/34.5 |
| 5,130,275 | 7/1992 | Dion | 437/192 |

FOREIGN PATENT DOCUMENTS

| | | | |
|---|---|---|---|
| 0316912 | 5/1989 | European Pat. Off. | 437/183 |
| 60-54456 | 3/1985 | Japan | 437/183 |
| 62-11251 | 1/1987 | Japan | 437/183 |
| 63-308330 | 12/1988 | Japan | 437/183 |

OTHER PUBLICATIONS

U. Lindborg, "A Model for the Spontaneous Growth of Zinc, Cadmium and Tin Whiskers" Acta Metallurgica, vol. 24, pp. 181-186, Pergamon Press 1976.

*Primary Examiner*—Tom Thomas
*Assistant Examiner*—Trung Dang
*Attorney, Agent, or Firm*—Clayton L. Satow; Barry N. Young; Albert P. Cefalo

[57] ABSTRACT

A method for for processing semiconductor chips which deters the formation of "tin whiskers" and which removes excess substrate material from the passive side of a semiconductor device is presented. The deterrence of tin whiskers is accomplished by controlling the size of the bead of flowable metal on the conductive bump. The removal of excess material from the passive side of the semiconductor device is accomplished by chemical reaction after the formation of the conductive bump.

2 Claims, 10 Drawing Sheets

POST FABRICATION PROCESSING OF SEMICONDUCTOR CHIPS

This application is a divisional of U.S. Pat. application Ser. No. 07/547,652, filed Jul. 2, 1990, now U.S. Pat. No. 5,130,275 and assigned to the assignee of the present application.

BACKGROUND OF THE INVENTION

This invention relates to the post fabrication processing of semiconductor chips. After circuits are patterned on semiconductor wafers, and the wafers are separated into individual chips in the chip fabrication process, a number of steps are done to prepare the chip for use in a piece of electronic equipment, such as a computer.

In order to communicate data with the piece of electronic equipment, the semiconductor devices must be electrically connected to the piece of electronic equipment, most commonly by electrically and mechanically attaching the semiconductor device to a circuit board. This interconnection is typically done by attaching the semiconductor device to electrical leads, which are then attached to the circuit board, or by attaching the semiconductor device to a substrate, which is then attached to circuit board.

A common method for providing such mechanical and electrical connection is through the use of "bumps" Bumps are portions of conductive material placed on the interconnect pads of semiconductor devices. Since interconnect pads are commonly placed on an axis of alignment parallel and proximate to each edge of the semiconductor device, the bumps are situated in a similar pattern. Bumps serve as both conductive paths and mechanical standoffs. A discussion of bumps is contained in U.S. Pat. No. 4,510,017, issued on Apr. 9, 1985 to Barber.

If the bump is composed of a different material than the interconnect pad, the bump may be subject to the formation of intermetallic material, often referred to as "intermetallics". Intermetallics are materials formed at the interface between two metals by the diffusion of one metal into the other. The degree to which intermetallics form is dependent on a number of properties of the two metals.

Intermetallics may have undesirable electrical properties, such as poor or unpredictable conductivity, or undesirable mechanical properties, such as brittleness. Aluminum is a common choice for the interconnect pads and gold is a common material for the bumps. However, the combination of aluminum and gold is prone to the formation of intermetallics.

To slow the rate of formation of intermetallics, a thin layer of a "barrier metal" is often placed between the gold and the aluminum. A barrier metal is a metal that does not form harmful intermetallics with either of the two metals that would be in contact, but has desirable electrical and mechanical properties, such as high and predictable conductivity, ductility, and resistance to corrosion. Chromium and titanium tungsten alloy are common materials used for a barrier metal layer between gold and aluminum.

The barrier metal layer metal layer can be added as a thin layer over the entire semiconductor device by a process such as sputtering. After further processing, the portion of the barrier metal layer, except the portion lying under the bumps is removed. A common material for removing a barrier layer composed of titanium tungsten alloy is a 30% solution of hydrogen peroxide in water.

One problem with some common barrier metal materials, such as titanium tungsten alloys, is that the surface of the barrier metal layer may oxidize during subsequent processing steps. This oxide layer may prevent subsequent layers from adhering to the barrier layer. Therefore, a layer of another metal such as gold, which is not subject to oxidation, is sometimes applied immediately after the application of the barrier layer. If the bump material is gold, the oxidization preventing layer can also serve as a base on which the gold bump can be built, and for that reason it is often referred to as a "seed layer". Next, the bump is formed, and the portion of the seed layer not lying under the bumps is removed by later processing. A common material for removing a gold seed layer is potassium cyanide.

Mechanical and electrical connection are often accomplished by a single method. Compression bonding and solder bonding are two common methods for accomplishing mechanical and electrical connection. An example of compression bonding can be found in U.S. Pat. No. 4,000,842, issued Jan. 4, 1977 to Burns, and in U.S. Pat. No. 4,188,438, issued Feb. 12, 1980, also to Burns.

Compression bonding, however, requires mechanical force and heat to be applied to the bumped device. The Burns patents both specify a temperature of 550° C. and a pressure of 100 grams per bump or 8 grams per square mil. Such high temperatures and pressures can damage the bumped device, the electrical leads, or the circuit board. Modern bumped devices may have as many as 600 bumps, which would require 60,000 grams of pressure according to the teaching of the Burns patents. This amount of force is sufficient to cause significant damage to semiconductor devices. Semiconductor devices are incapable of withstanding such pressure. The amount of pressure that must be applied at one time can be reduced by bonding only a portion of the bumps with each application of pressure. However, this results in a longer, more expensive manufacturing process, and may exposes the circuit board to the high temperature for a longer time.

In solder bonding, a bead of flowable metal, such as tin or tin-lead solder, is applied to each bump. A typical method of applying the flowable metal is illustrated in U.S. Pat. No. 3,625,837, issued Dec. 7, 1971 to Nelson et al. In Nelson et al., a calcium magnesium aluminosilicate glass layer is formed over the semiconductor device by a sputtering process. The portion of glass layer over the terminal areas is then etched away. Next, layers of chromium and copper are deposited on the entire semiconductor device. A mask is then formed over the semiconductor device using photoresist and photographic techniques to leave an opening in the photoresist layer that is slightly larger than the openings below them in the glass layer. The solder is then applied to the openings using electrodeposition. The portion of the copper and chromium layers that are exposed, that is that do not lie under the solder, are then removed by a suitable etchant. Heat is then applied, which causes the solder to form rounded bumps.

In recent years, the number of bumps on each chip has increased. One result has been that the nominal distance between the adjacent edges of adjacent bumps (hereinafter referred to as "nominal bump spacing") has decreased. In a typical modern semiconductor device, the nominal bump spacing is 0.006 in. (0.1524 mm), with some devices having a nominal bump spacing of 0.004 in. (0.1016 mm). The processes currently used to deposit solder beads on bumps, such as described by the Nelson patent, deposit the solder across the entire exposed surface of the bump, that is the upper and side surfaces of the bump.

This close spacing has made the bumped devices subject to a phenomenon known as "tin whiskering". Tin whiskering is the propensity of metals such as tin to grow thin crystals projecting outward from the portions of solder on the bumps. Tin whiskers tend to grow in the same direction as the crystals of the hardened solder. Tin whiskering is discussed in more detail in the article "A Model for the Spontaneous Growth of Zinc, Cadmium, and Tin Whiskers", by U. Lindborg, published on pages 181 through 186 in Acta Metallurgica, Vol. 24 (Pergamon Press, 1976). Tin whiskers growing on solder beads or on tin electronic leads may eventually grow long enough that they touch the adjacent solder bead or the adjacent electronic lead or they may touch a tin whisker growing from an adjacent solder bead or electronic lead. This can result in an electrical short circuit. Electrical short circuits caused by tin whiskers are particularly troublesome, because it is difficult to predict where and when they will occur.

Semiconductor chips are normally processed such that the circuitry is patterned on only one side of the substrate. The side on which the circuitry is patterned is called the active side of the substrate. The other side of the chip is called the passive side or the backside of the substrate.

Chip performance can be improved by processing the passive side of the substrate. Two operations that are often done to the passive side of the substrate are thinning and depositing a protective layer to the passive side of the substrate. Thinning is typically done by a lapping process in which an abrasive substance removes material from the passive side of the substrate. Thinning may also be done by the action of chemicals. This is typically done during the fabrication process. If it is done during the fabrication process, the active side of the semiconductor device needs to be protected from the chemical, which adds and extra process step.

The material deposited on the passive side of the substrate is typically a conductor such as gold, and is typically deposited by electrodeposition.

In summary, the post fabrication processing of bumped semiconductor devices includes the steps of placing a barrier metal layer on the interconnect pads of the semiconductor device; applying a seed layer on top of the barrier metal layer; depositing a bump on the portion of the seed layer which lie over the interconnect pads of the semiconductor device; depositing a solder bead over the exposed surfaces of the bump; optionally, depositing a coating on the passive side of the substrate; removing the portion of the seed layer which does not lie under the bumps; and removing the portion of the barrier metal layer with a 30% hydrogen peroxide solution. We now proceed to a summary of the invention.

SUMMARY OF THE INVENTION

The active side of a semiconductor device, such as an integrated circuit chip which has interconnect pads on the active side, is first coated with a barrier metal layer, then a seed layer. A layer of photoresist is then applied to the active side of the semiconductor device, and an opening is formed in the photoresist layer on each of the interconnect pads of the device, using photolithography. Bumps are then deposited in the openings by electrodeposition. Before the photoresist layer is removed, the semiconductor device is then made thinner, by removing material from the passive side of the semiconductor device. The material is removed by exposing the passive side to a chemical which dissolves the substance from which the substrate of the semiconductor device is made. The photoresist layer is then removed.

If a passive side coating is desired, it is then applied and annealed. Next, a layer of photoresist is formed on the active side of the device. An opening in the photoresist layer is then created over each bump using common photolithographic techniques. Each opening in the photoresist layer is 15% to 30% narrower than the bump on which it is placed, when measured along a line connecting the bump with the adjacent bump. Solder is then deposited in the openings in the photoresist layer using electrodeposition. The photoresist layer is then removed. If a coating has been deposited on the second side, it is then covered by a protective coating. The portions of the seed layer not lying under the solder bead is removed. The portion of the barrier metal layer not lying under the bump are then removed from the active side of the semiconductor device using a peroxide solution, with sufficient hydroxide ions added to bring the pH to between 9 and 11. The protective layer is then removed from the passive side of the semiconductor device. The conductive pads, each of which consists of an interconnect pad, a bump, and a solder bead, are then attached to a circuit board or to an electrical lead.

A more detailed description of the invention will be facilitated by reference to drawings, which will now be described.

We will now proceed to a detailed description of the invention.

DETAILED DESCRIPTION OF THE INVENTION

Figure 1:
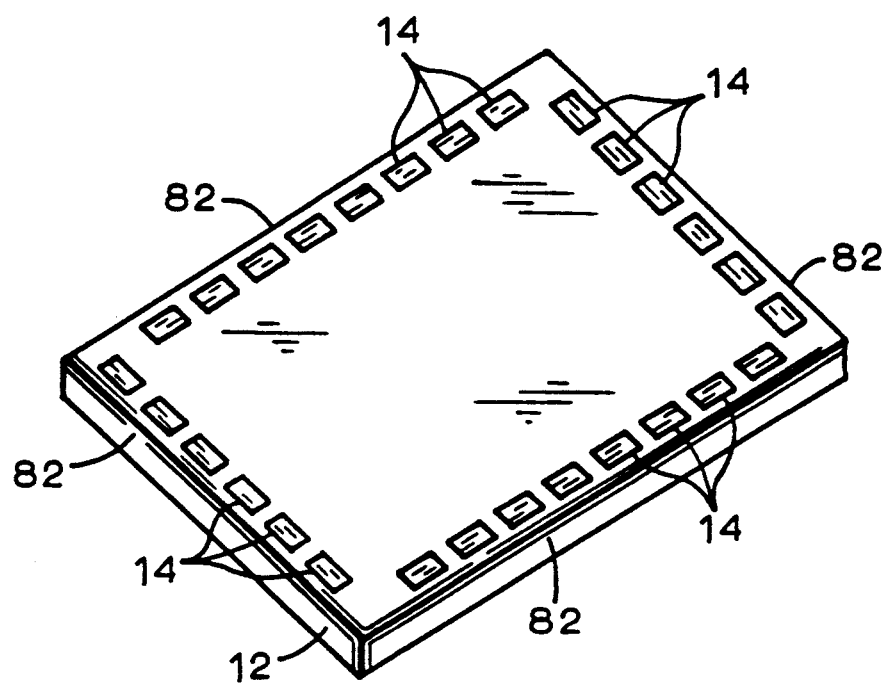
FIG. 1 is a perspective view of a semiconductor device as it comes from the semiconductor fabrication process.

FIG. 1 shows the semiconductor device 10 which is manufactured by processes well known in the art. The semiconductor device 10 consists of a substrate 12 on which is patterned the transistors and other elements (not shown), the power and signal paths interconnecting the transistors and other elements (not shown), and the power and signal paths (not shown) which terminate at interconnect pads 14. Substrate 12 is generally rectangular or square, typically a piece of silicon approximately 0.019 inches (0.4826 mm) thick or gallium arsenide approximately 0.007 inches (0.1778 mm) thick and with sides 0.1 inches (2.54 mm) to 0.5 inches (16.129 mm) in width. The thickness of the substrate 12 is the original thickness, as not thinning has yet been performed. The top and bottom surfaces are generally planar and parallel. Interconnect pads 14 provide a point at which signals can be transmitted to and from the semiconductor device and at which power can be transmitted to the device. Interconnect pads 14 are made of an electrically conductive material, typically aluminum or gold, and, when viewed from above, are usually square or round, but may be some other convenient shape. They are typically 100 microns across and between 1 and 3 microns thick. There may be over a hundred integrated circuit interconnect pads 14 on the semiconductor device 10. Interconnect pads 14 are normally aligned, with the axis of alignment parallel and proximate to the side 82 of the integrated circuit chip 10. There may be more than one row along an edge of the integrated circuit chip 10. In addition, other bump patterns are possible, with bumps placed at many points on the semiconductor device.

Figure 2:
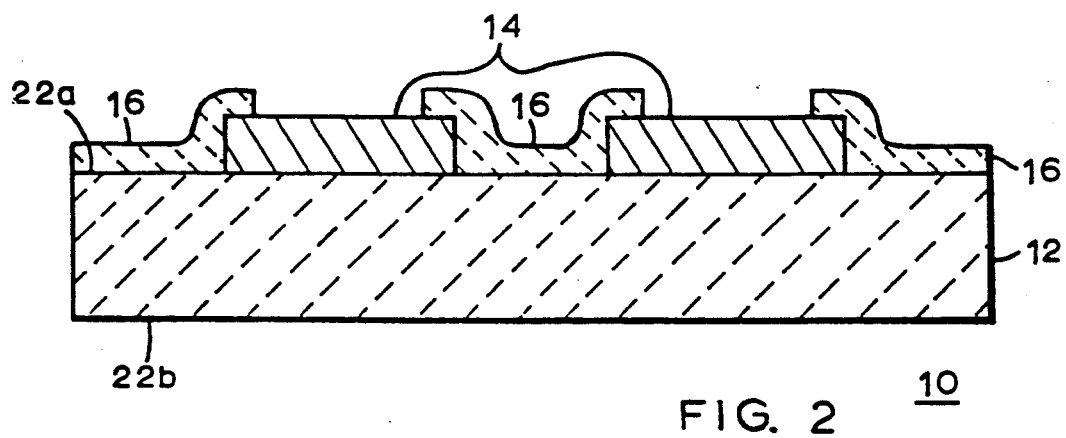
FIG. 2 is a cross sectional view of a semiconductor device as it comes from the semiconductor fabrication process.

Referring to FIG. 2, the transistors and other elements (not shown) are on the active side 22a of the substrate 12. There are typically no transistors or elements on the passive side 22b of the substrate 12. Passivation layer 16, which covers the active side 22a of the substrate 12 is a layer of an electrical insulator, such as silicon dioxide, that electrically isolates the integrated circuit chip 10 and protects the substrate 12 from damage during subsequent manufacturing steps. The passivation layer 16 is formed as a part of the fabrication process of the semiconductor device 10. There is an opening 13 in the passivation layer 16 over each of the interconnect pads 14. When viewed from above, the openings 13 in the passivation layer 16 are the same shape as the interconnect pads 14, but are slightly smaller. Both top and bottom surfaces of the passivation layer conform to the topology of the active side 22a of the substrate 12. The thickness of the passivation layer is typically 2000 Angstrom Units.

Referring now to FIGS. 3 to 16, the processing of the semiconductor device 10 will now be described.

Figure 3:
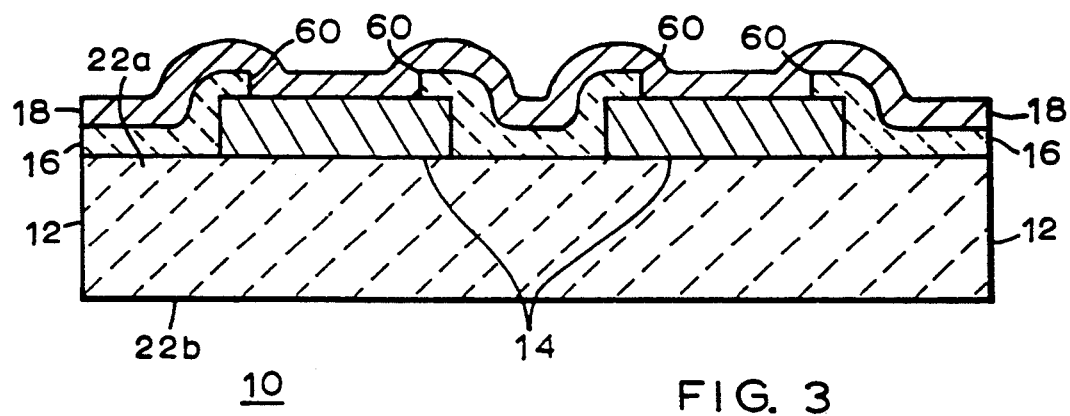
FIGS. 3 through 16 are cross sectional views of the semiconductor device at different stages of the sequential processing.

The barrier metal layer 18 of an alloy of 10% by weight titanium and 90% by weight tungsten is placed on the entire active side 22a of the substrate 12 immediately above the passivation layer 16 and the interconnect pads 14, as shown in FIG. 3. The barrier metal layer 18 is a coating that is thin relative to the substrate 12. The coating is of a relatively uniform thickness. The bottom surface of the barrier metal layer 18 conforms to the top surface of the passivation layer 16 and the interconnect pads 14. The top surface of barrier metal layer 18 takes on a rounded shape 62 at corners 60 of the passivation layer 16 which are at approximately right angles. The nominal thickness of the barrier metal layer 18 is typically 3000 to 7000 Angstrom units and can be deposited by a number of processes well known to the art, such as sputtering.

Figure 4:
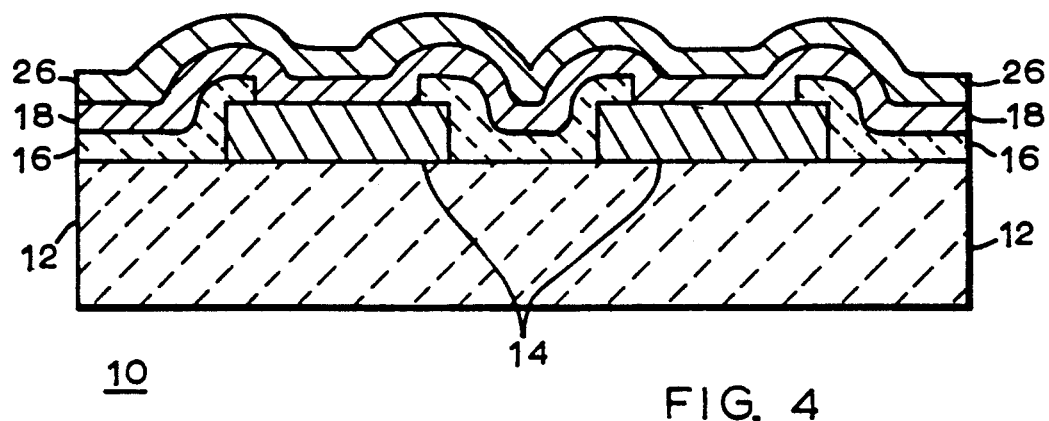

FIG. 4 shows the semiconductor device 10 after the deposition of the seed layer 26. Seed layer 26 covers the entire barrier metal layer 18. Seed layer 26 is a coating that is thin relative to the substrate 12, and is of a relatively uniform thickness. The top and bottom surfaces of seed layer 26 conform to top surface of the barrier layer 18. Seed layer 26 is often composed of the same material as the bump, but may be some other material. Common seed layer materials are copper or gold. Seed layer 26 is normally between 1000 and 4000 Angstrom units thick and can be deposited by a number of processes familiar to the art, such as sputtering.

Figure 5:
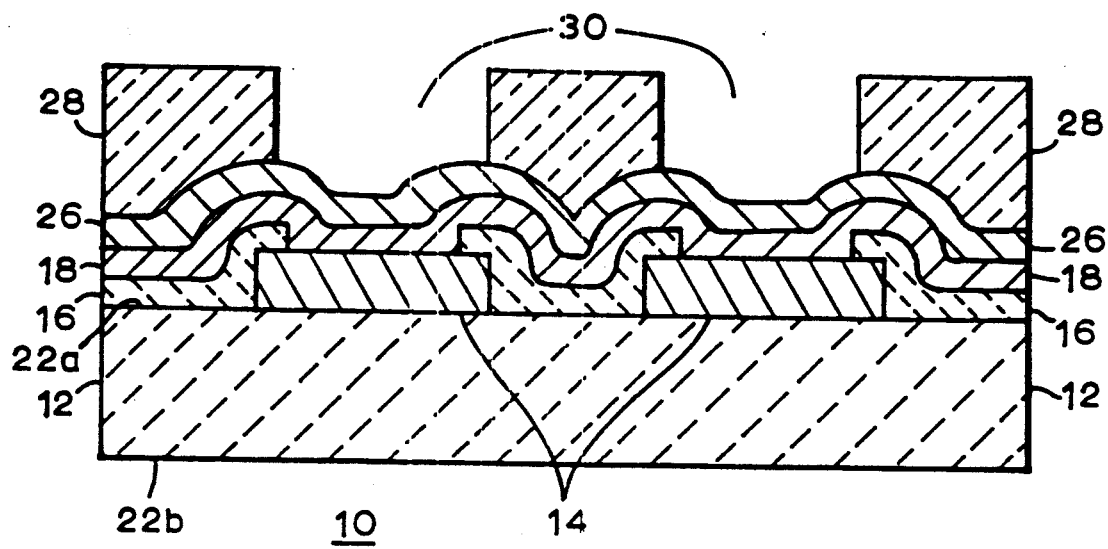

Then next step is a photolithograpic step resulting in FIG. 5. Layer of photoresist 28 is deposited on the seed layer 26. The bottom surface of photoresist layer 28 conforms to the top surface of the seed layer 26 and the top surface of the photoresist is relatively planar. The thickness of the photoresist layer 28 at the location of the bump is greater than the thickness of the bump which is added in a subsequent step. A typical bump thickness is 25 microns and a typical thickness of a photoresist layer at the location of the bump is 35 microns. The photoresist layer is composed of materials well known to the art, and is deposited by spinning or spin casting.

By photolithographic techniques well known to the art, an opening 30 is formed in the photoresist layer 28. Openings 30, when viewed from above are approximately the same shape as interconnect pads 14. The size of openings 30, when viewed from above is slightly smaller than the size of the interconnect pads 14, but slightly larger than the opening in the passivation layer 16.

The photoresist layer 28 serves as a mask to ensure that the bump material gets deposited on the bump location, but not at other areas of the semiconductor device 10.

Figure 6:
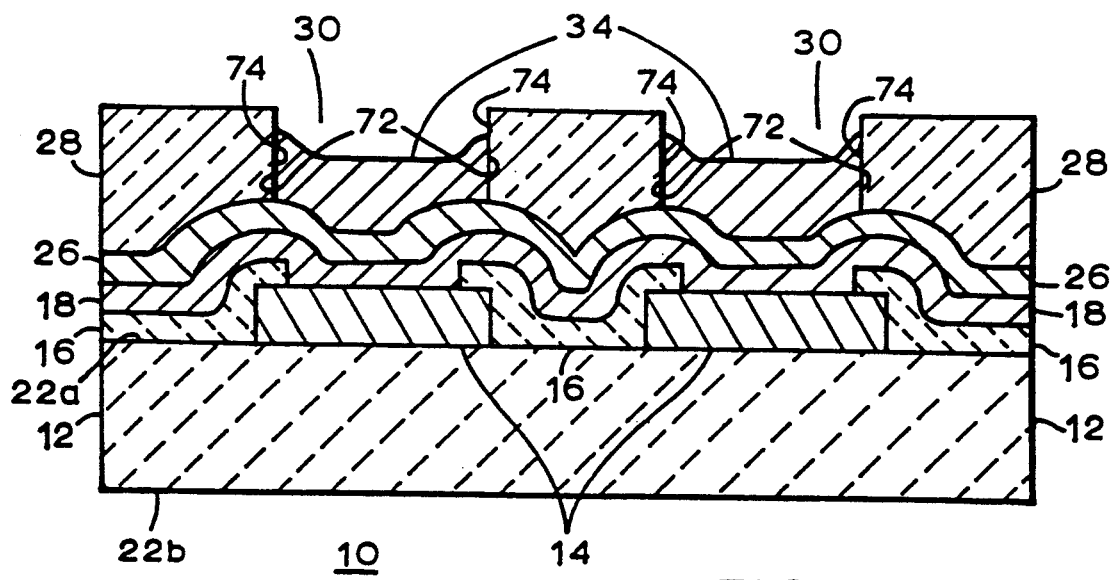

The bumps 34 are then deposited into the holes 30 in the photoresist layer, resulting in a configuration as shown in FIG. 6. Bumps 34 are typically composed of gold or copper, and are deposited by methods familiar to the art, such as electrodeposition. The edges 72 of the bumps are defined by the walls 74 of the openings 30, which are approximately perpendicular to the plane of the active side 22a of the semiconductor device 10. The top surface of the bump 34 conforms to the top surface of the seed layer 18. The bottom surface of the bump 34 conforms to the top surface of seed layer 18.

Figure 7:
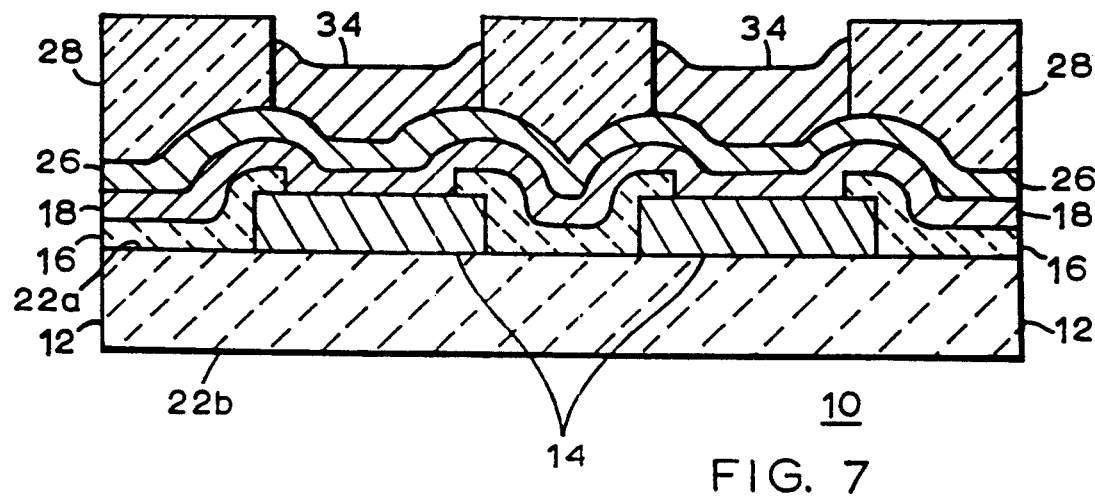

Referring now to FIG. 7, material is removed from the passive side 22b of the substrate 12. The material is removed uniformly, from the entire surface if the passive side 22b of the substrate 12, so that the passive side 22b of the substrate 12 remains planar. The material is removed by exposing the passive side 22b to a chemical, such as a solution of 10% by volume reagent grade hydrofluoric acid and 90% by volume reagent grade nitric acid that dissolves the material of the substrate 12, typically silicon, but does not react with the photoresist layer 28 or the bumps 34. A mixture of these proportions will normally remove 0.0001 in of semiconductor grade silicon per minute. Therefore, to accomplish a typical reduction of 0.003 in, the substrate 12 is exposed to the hydrogen peroxide and hydrofluoric acid solution for 30 minutes. Since the photoresist layer 28 and the bumps 34 protects the active side 22a of the substrate 12, no material is removed from the active side 22a of the substrate 12. Thus, the photoresist layer 28 serves both as a mask for the deposition of the bumps and as a protective coating to prevent damage to the active side 22a of the substrate 12 while material is removed from the passive side 22b of the substrate 12.

Figure 8:
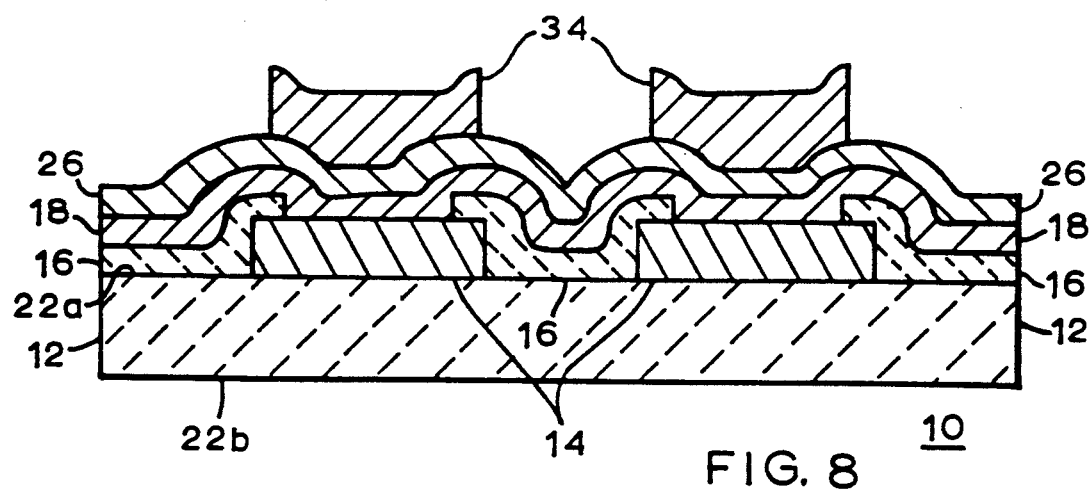

Next, the remaining photoresist is removed by methods well known to the art, resulting in FIG. 8. The removal of the remaining photoresist exposes the bumps 34 and the portion of the seed layer 26 not lying under the bumps 34.

Figure 9:
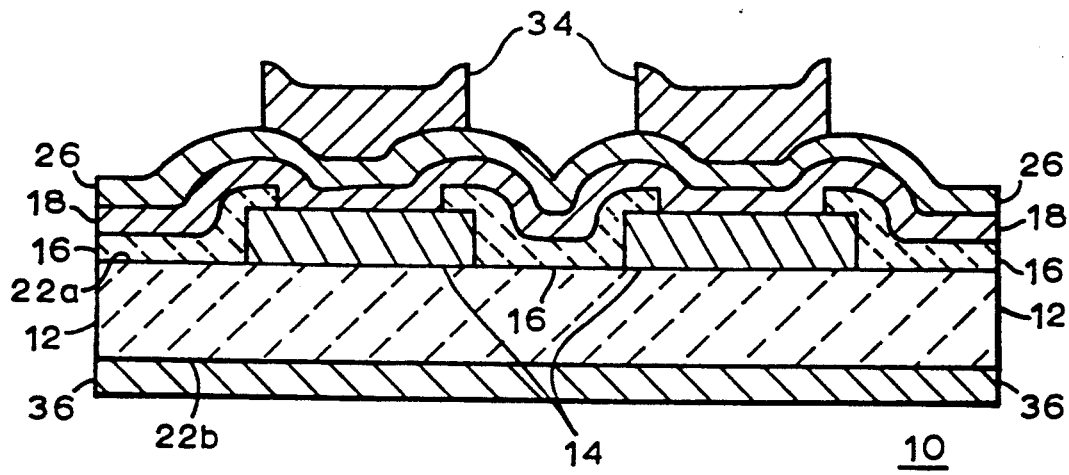

As shown in FIG. 9, if a passive side coating 36 is desired on the passive side 22b of the substrate 12, passive side coating 36 is now deposited, using a methods well known to the art, such as sputtering. The material is deposited uniformly, so that both surfaces of the coating are generally planar and parallel to the passive side 22b of the substrate 12. Passive side coating 36 is then annealed by exposing the semiconductor device 10 to a temperature of 350 to 400 degrees Celsius for a time of 20 to 30 minutes. The annealing aids the bonding of the passive side coating 36 to the passive side 22b, and repairs any damage to transistors that may have been caused by the sputtering process. Sputtering may cause a shift in the threshold voltage of a transistor, and the annealing returns the threshold voltage to near its original value. Typically, the passive side coating 36 is made of gold, and is 1000-3000 Angstrom units thick. This deposition of passive side coating 36 is optional. Subsequent drawings will show the coating 36, but those skilled in the art will recognize that subsequent steps in the process can be performed without coating 36.

Figure 10:
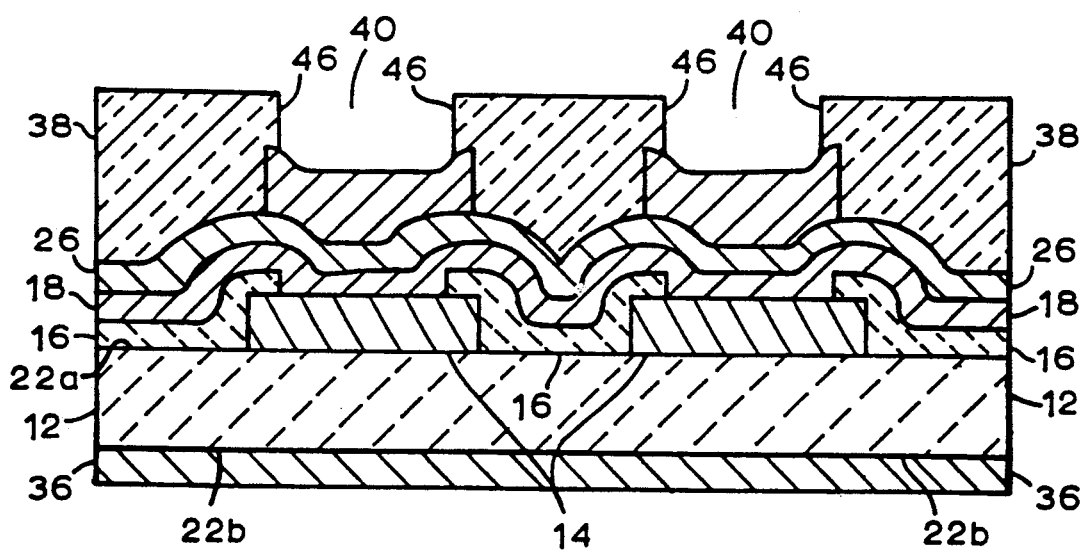

The next step is a photolithography step that results in the configuration shown in FIG. 10. A photoresist layer 38 is deposited on the seed layer 18 and the bumps 34. The bottom surface of photoresist layer 38 conforms to the top surface of the seed layer 26 and the bumps 34. The top surface of photoresist layer 38 is relatively planar. The photoresist layer is composed of materials well known to the art, and is deposited by spinning or spin casting. The thickness of photoresist layer 38 at the location of the solder bead is greater than the thickness of the solder bead to be applied subsequently to ensure that the solder beads are contained in the openings 40 and to allow for variations the thickness of the photoresist. A typical solder bead thickness is 4 microns and a typical photoresist layer thickness at the location of the photoresist is 35 microns.

By photolithographic techniques well known to the art, a portion of the photoresist layer 38 that lies above the bumps is removed, resulting in openings 40 in the photoresist layer 38 which lie above the bumps 34. Openings 40, when viewed from above are approximately the same shape of the bumps 34. The walls 46 of the openings 40 are perpendicular to the plane of the top of the active side 22a of the substrate 12. The distance between opposite walls 46 of the openings 40, measured along a line connecting each wall 46 with the adjacent opening 40, is 15% to 30% less than the nominal width of the bumps 34, measured along the same line. Opening 40 is situated such that it is the distance between the adjacent edges of adjacent bumps is greater than the distance between adjacent walls of adjacent openings.

The photoresist layer 38 serves as a mask to ensure that the solder bead material gets deposited on the bump location, but not at other areas of the semiconductor device 10, and ensures that the solder bead 44 is narrower than the bump 44, when measured on a line connecting the bump with the adjacent bump.

Figure 11:
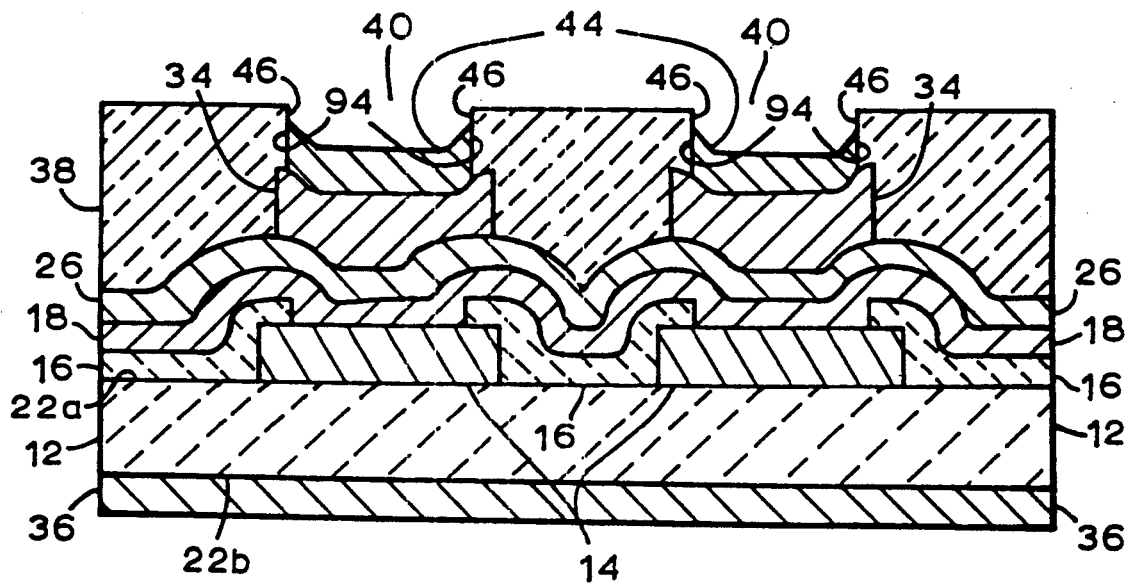

FIG. 11 shows the semiconductor device 10 after the flowable alloy, in the preferred embodiment a solder bead 44 of tin, is deposited in the openings 40 in the photoresist layer 38 by methods well known to the art, such as electroplating. The thickness of the solder bead 44 is dependent on the solder material. If the solder is tin, the thickness is typically 2 to 4 microns. The edges 94 of the solder bead 44 are defined by the walls 46 of the openings 40. The top and bottom surfaces of the solder bead 44 conform to the top of the bump 34 over which it lies. Therefore, the top and bottom surfaces of the solder bead 44 may slope upwardly as shown in the drawings, or may be planar, depending on the topology of the portion of the bump covered by the solder beads 44.

Figure 12:
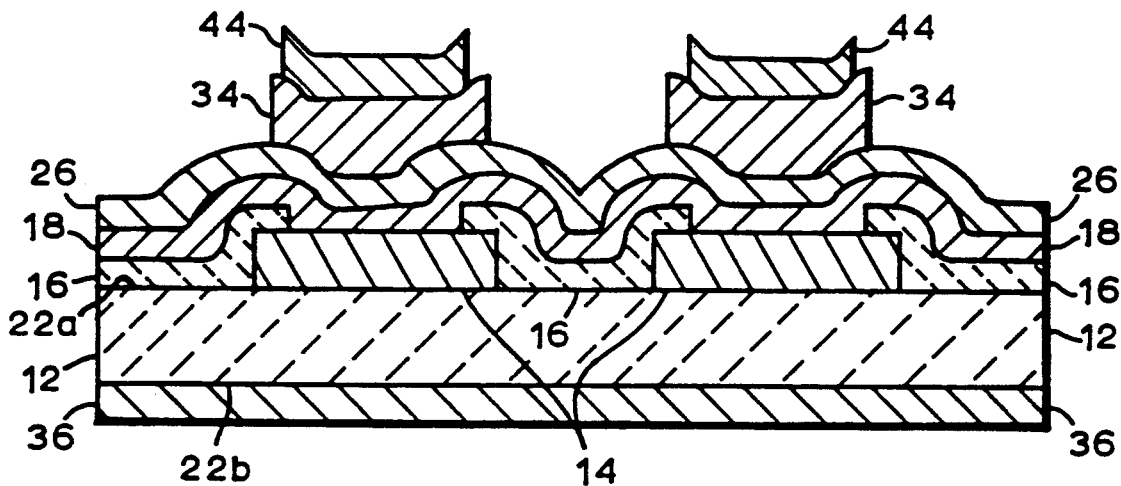

Referring now to FIG. 12, the photoresist layer is then stripped away by methods well known to the art, exposing the solder bead 44, the portion of the bumps 34 not lying under the solder bead 44, and the portion of the seed layer 26 not lying under the bumps 34. In the preferred embodiment of the invention, the nominal width of the solder beads is 15% to 30% less than the nominal width of the bumps 34. The nominal distance between the adjacent edges of adjacent solder beads is greater than the nominal distance between the adjacent edges of adjacent bumps.

Figure 13:
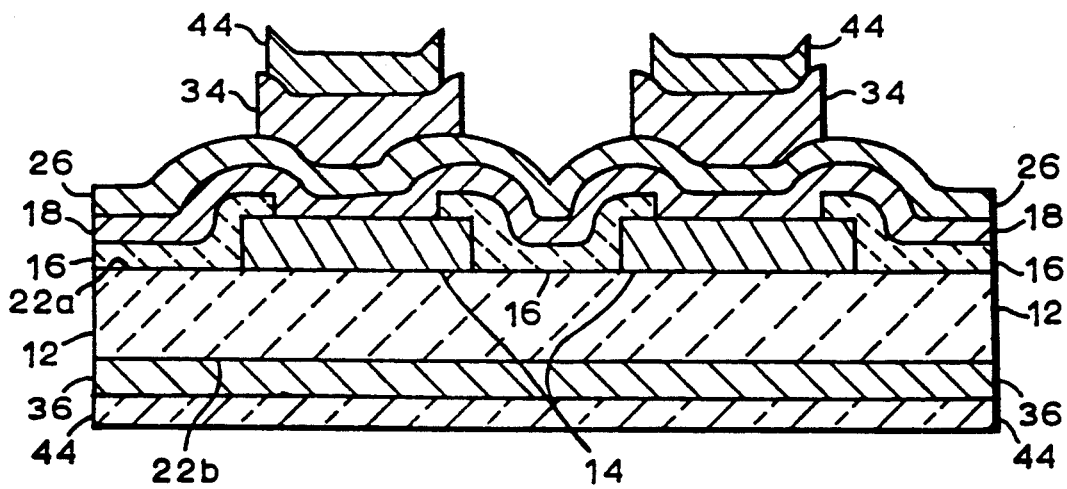

Referring now to FIG. 13, a protective layer 46 is applied over the entire surface of the passive side coating 36. The protective layer 46 may be photoresist or a protective tape, and is typically uniform in thickness. This step may be omitted if application of passive side coating 36 has been omitted.

Figure 14:
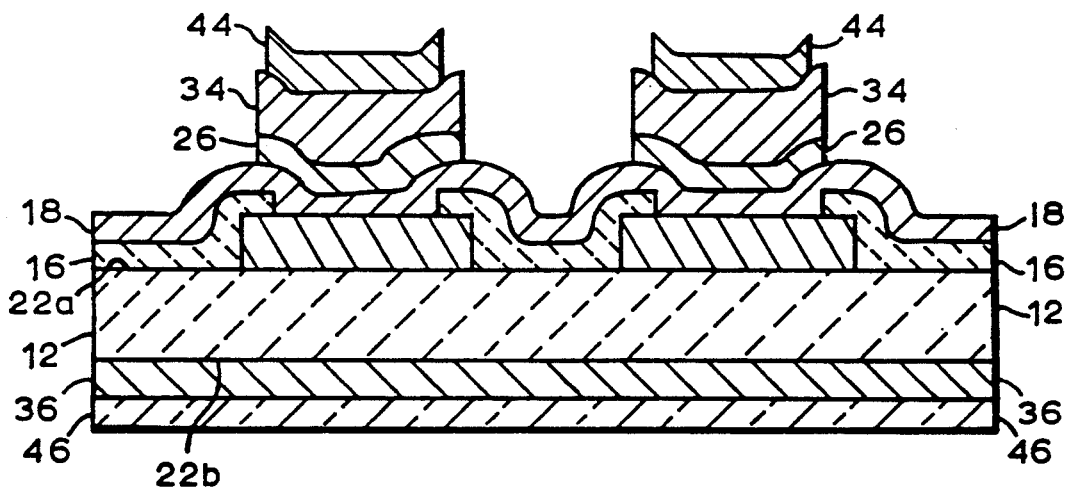
Figure 15:
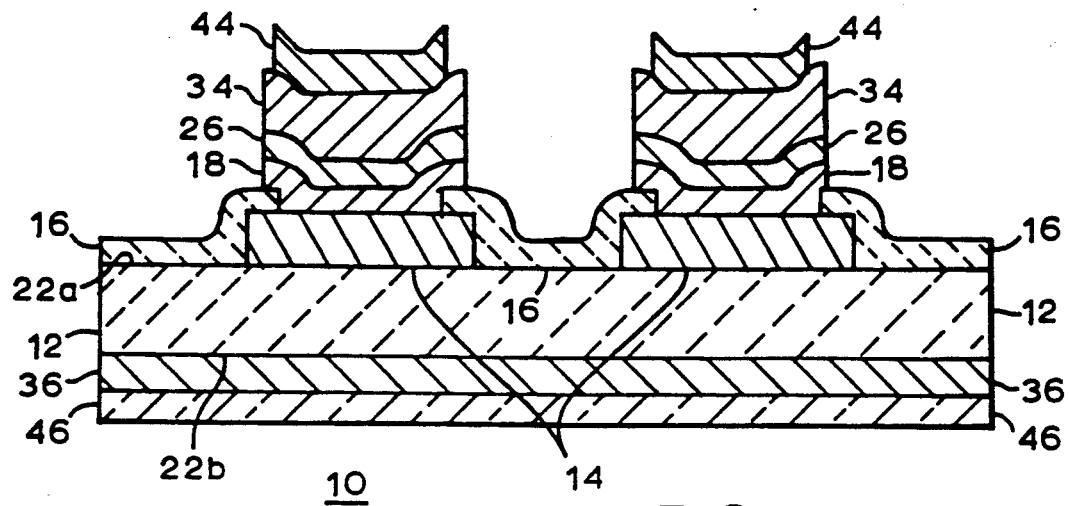

FIG. 14 shows the semiconductor device after the portion of the seed layer 26 not lying under a bump is etched away, exposing the portion of the barrier metal layer 18 not lying under one of the bumps 34. If the seed layer 26 is gold, it is removed by exposure to a 10% solution of Potassium Cyanide for 90 seconds. Since the bumps 44 are also gold, the potassium cyanide solution also attacks the bumps 44. However since the bumps 44 are 25 microns thick while the seed layer 26 is 0.3 microns thick, the amount of each bump that is removed is a small fraction of the bump.

Figure 16:
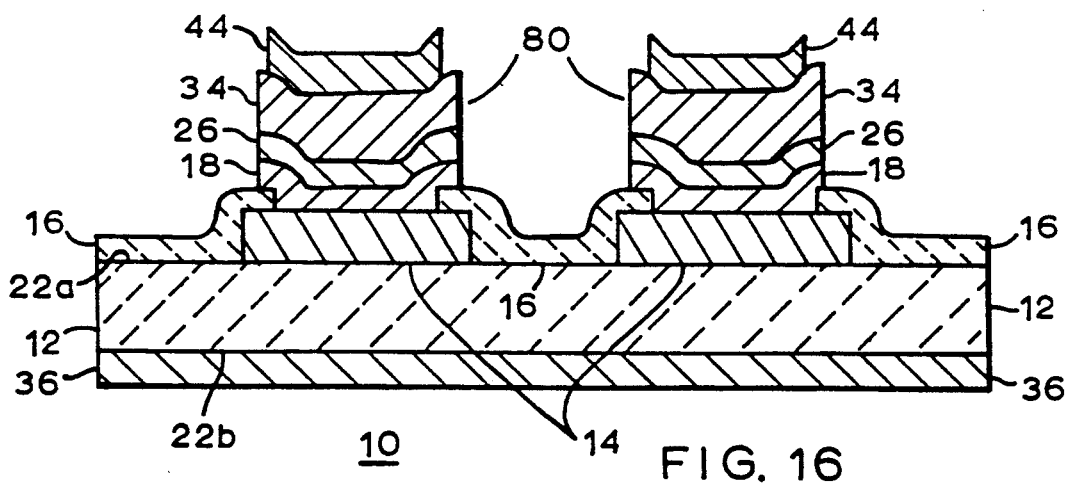

The portion of the barrier metal layer 18 that is not under the bumps 34 is then etched away, exposing the passivation layer 16 and resulting in the configuration shown in FIG. 16. A typical etchant is a source of unstable oxygen, normally referred to as a peroxide. The most common is a 30% solution of hydrogen peroxide in water. However, peroxides can corrode the solder bead 44 as well as dissolve the barrier metal layer 18. A method of preventing the peroxide from attacking the solder bead 44 is to add a source of OH ions such that the pH of the solution is between 9 and 11. In the preferred embodiment, the etchant is a 7% solution of oxidized ammonium persulfate and hydrogen peroxide at 1% to 2% with sufficient ammonium hydroxide added to bring the pH to between 9 and 11. The etchant may also attack the portion of the barrier metal layer lying under the bump, but the amount removed is minimal, due to fact that the barrier metal layer is wide (in the range of 100 microns) relative to its thickness (in the range of 0.3 microns).

Referring now to FIG. 16, the passive side protective layer 46 is removed by methods well known to the art, thereby exposing passive side coating 36. Conductive pads 80, each consisting of a solder bead 44, a bump 34, and an interconnect pad 14 have now been formed, and the semiconductor device is now ready to be attached to the circuit board or an electrical lead.

Figure 17A:
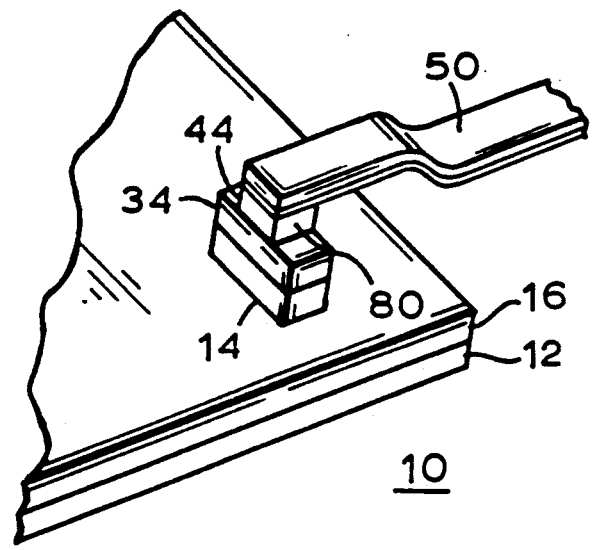
FIGS. 17a and 17b are perspective views of a TAB lead attached to an electrically conductive pad made according to the invention.
Figure 17B:
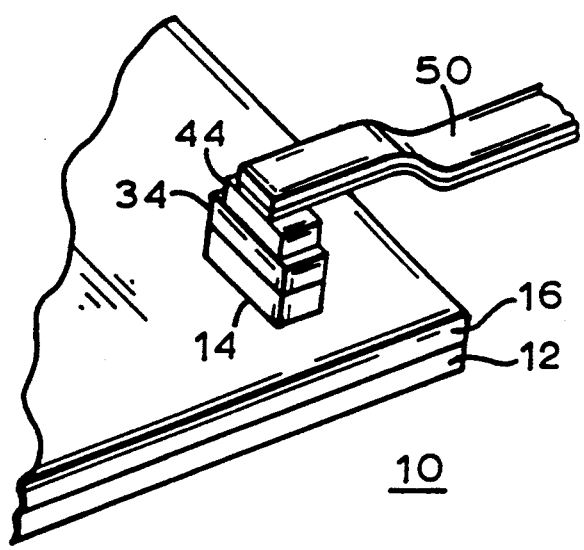

FIGS. 17a and 17b show the semiconductor device if a tape automated bonding (TAB) lead is to be attached to the conductive pad. For clarity, the portion of passivation layer 16 which covers the side and a portion of the top of interconnect pad 14 is not shown. The TAB lead 50 is placed against the solder bead 44. In FIG. 17a, the TAB lead 50 is typically an elongated base of copper, which may covered by one or more layers of metal and a width of no greater than the width of the solder bead 44. Downward pressure sufficient to hold the TAB lead 50 in place and to maintain contact between the solder bead 44 and the TAB lead 50, is applied. Pressure of 15 grams per lead per lead is normally sufficient. The solder is then heated to a temperature sufficient to cause the solder to begin to flow, normally in the range of 500 degrees Celsius. The solder is then cooled to room temperature (approximately 20 degrees Celsius) causing it to solidify, thereby forming a mechanical, electrically conductive bond between the TAB lead 50 and the conductive pad 80 on semiconductor device 10. When the heat is applied, the material of the solder bead 44 begins to flow outwardly, causing the solder bead 44 to deform. If the initial width of the solder bead 44 is at least 15% to 30% less than the width of the bump, the solder outward flow of the solder will result in solder beads 44 that are at most the same width as the bumps 44, but typically narrower than the bumps 44, as shown in FIG. 17b. Surface tension may cause the solder to adhere to the sides of TAB lead 50, not shown in this figure. While only one TAB lead is shown, those skilled in the art will recognize that this same process is applicable to the more common case of up to 600 leads.

Figure 18A:
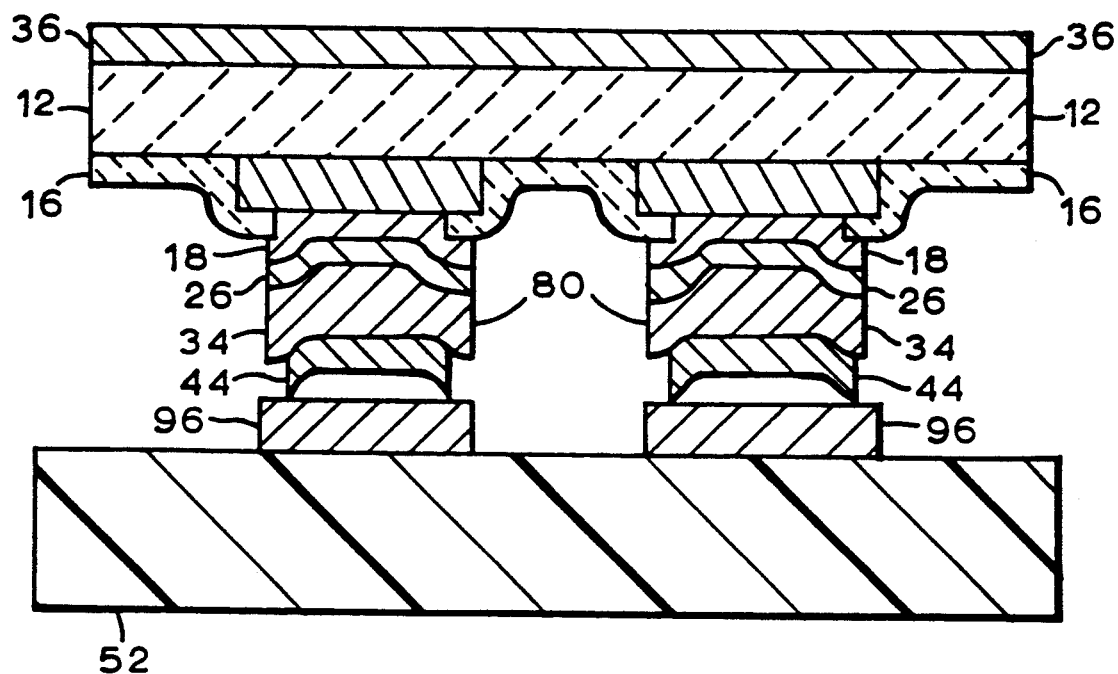
FIGS. 18a and 18b are cross sectional views of a semiconductor device with a conductive pad made according to the invention, attached to a pad on a substrate.
Figure 18B:
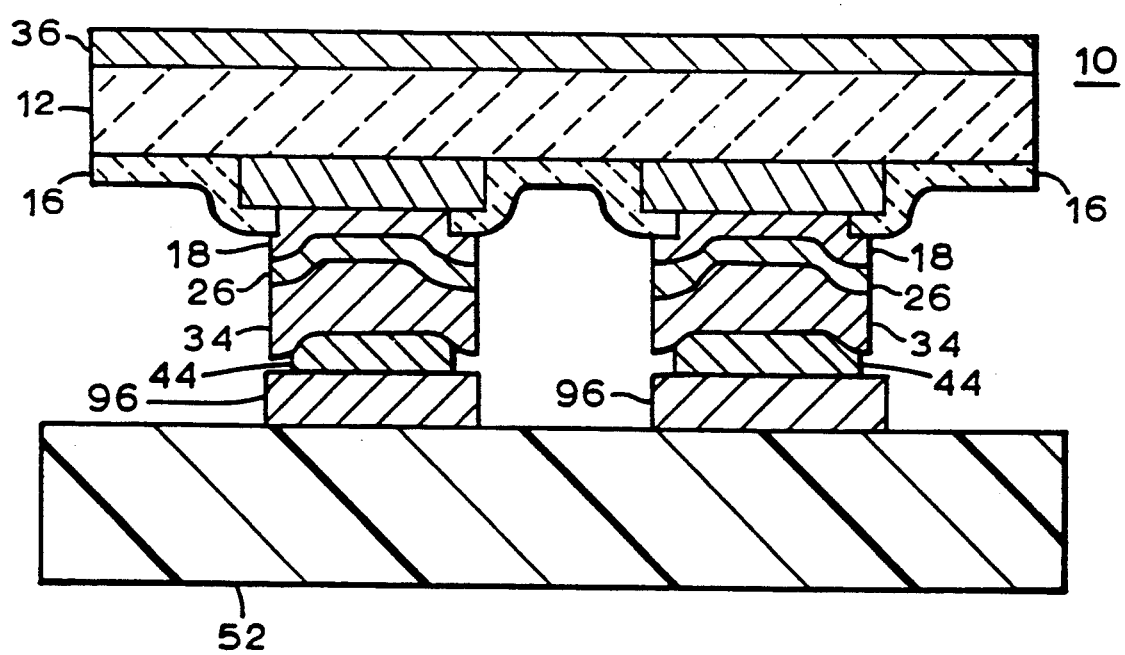

Another method of connecting the semiconductor device 10 to a substrate 52 is shown in FIGS. 18a and 18b. In FIG. 18a, the semiconductor device 10 is inverted and placed on the substrate 52 with the solder bead 44 facing down. Solder bead 44 is placed such that it is in contact with a substrate interconnect pad 96. Pressure in the range of one pound is then applied, and solder bead 44 is heated to a temperature sufficient to cause the solder bead 44 to flow, typically 300 to 500 degrees Celsius in the case of tin solder. The solder bead 44 is then cooled to room temperature (approximately 20 degrees Celsius) causing it to solidify, thereby forming a mechanical, electrically conductive connection between the semiconductor device 10 and the substrate interconnect pad 96. When the heat is applied, the material of the solder bead 44 begins to flow outwardly. If the initial width of the solder bead 44 is at least 15% to 30% less than the width of the bump, the solder outward flow of the solder will result in a solder bead that is at most the same width as bump 44 but typically narrower than the bump, as shown in FIG. 18b.

In all the Figures, certain dimensions have been greatly exaggerated to facilitate descriptions, and certain details that are not essential to the description of the invention have been omitted. The drawings show the semiconductor device with only one or two bumps. Those skilled in the art will appreciate that the invention is equally applicable to the more common situation in which there are many bumps on each semiconductor device.

The invention having thus been described, it will be apparent to those skilled in the art that the invention may be practiced in many ways other than as specifically described, while remaining within the spirit and scope of the invention as described in the appended claims.

I claim:

1. A method for removing a barrier metal layer from a semiconductor device comprising the step of exposing the said semiconductor device to a solution containing a peroxide and oxidized ammonium persulfate.

2. A method for removing a barrier metal layer from a semiconductor device as in claim 1, said oxidized ammonium persulfate being approximately 7% of the solution by weight.

* * * * *